United States Patent [19]
Naito et al.

[11] Patent Number: 6,066,991
[45] Date of Patent: May 23, 2000

[54] STABILIZED OSCILLATOR CIRCUIT

[75] Inventors: Akio Naito, Kawasaki; Atsushi Ogawa, Chigasaki, both of Japan

[73] Assignee: Kabushiki Kaisha Toshiba, Kawasaki, Japan

[21] Appl. No.: 09/220,056

[22] Filed: Dec. 23, 1998

[30] Foreign Application Priority Data

Dec. 24, 1997 [JP] Japan ................................. 9-355435

[51] Int. Cl.$^7$ ................................. H03B 5/04; H03B 5/12
[52] U.S. Cl. ..................... 331/75; 331/117 R; 331/175; 331/186; 455/258; 455/318
[58] Field of Search .................. 331/75, 74, 117 FE, 331/117 R, 117 D, 116 FE, 116 R, 185, 175, 186; 455/255, 258, 318–322

[56] References Cited

U.S. PATENT DOCUMENTS 3,649,929  3/1972  Thompson ........................ 331/61
4,825,178  4/1989  Culican et al. ................... 31/116 R
5,874,865  2/1999  Fairgrieve ........................ 331/75

FOREIGN PATENT DOCUMENTS 60-180333  9/1985  Japan.

*Primary Examiner*—David Mis
*Attorney, Agent, or Firm*—Oblon, Spivak, McClelland, Maier & Neustadt, P.C.

[57] ABSTRACT

A stabilized oscillator circuit is provided with a differential amplifier type oscillator circuit for generating an oscillation signal, and a differential amplifier type buffer output circuit for amplifying and outputting the oscillation signal. The stabilized oscillator is also provided with a frequency variation stabilizing circuit. This circuit controls the amount of current of the constant current source I2 of the buffer output circuit, in accordance with fluctuations of the power supply voltage applied to the oscillator circuit. Accordingly, the collector-base capacitance of the transistors of the buffer output circuit is controlled, and the oscillation frequency variations are suppressed in spite of fluctuations of the power supply voltage.

20 Claims, 7 Drawing Sheets

STABILIZED OSCILLATOR CIRCUIT

BACKGROUND OF THE INVENTION

The present invention relates to an oscillator circuit formed in a semiconductor integrated circuit (IC), specifically to a stabilized oscillator circuit in which the oscillation frequency variations due to power source fluctuations are suppressed. The oscillator is used, for example, in an FM radio receiver circuit incorporated in a battery-driven portable device.

In the conventional art, the local oscillator circuit of the FM radio receiver of a battery-driven portable device, such as a portable tape recorder or a portable CD player, is formed as part of a semiconductor integrated circuit. A specific example of such a local oscillator circuit is a differential amplifier type oscillator circuit shown in FIG. 9, or a Colpitts oscillator. As can be seen from these examples, the local oscillator is comparatively simple in configuration.

In the case of the differential amplifier type oscillator circuit shown in FIG. 9, an oscillation signal from a differential amplifier type oscillator circuit 91 is output after being amplified by a differential amplifier type buffer output circuit 92.

The differential amplifier type oscillator circuit 91 is made up of: NPN transistors Q1 and Q2 which constitute a differential amplifier circuit, with their bases and collectors cross-connected (that is, the base and collector of one transistor are connected to the collector and base of the other transistor, respectively); a first constant current source I1 connected between the common emitter node of the NPN transistors Q1 and Q2 and a ground potential node; and a resonator circuit 90 connected between a power supply node and the collector of NPN transistor Q2 (the inductor component of the resonator circuit is denoted by L, and the capacitor component is denoted by C). The collector of NPN transistor Q1 is connected to the power supply node.

The resonator circuit 90 is normally a resonator provided as an external component of an IC, and the circuits other than the resonator circuit 90 are incorporated inside the IC.

The differential amplifier type oscillator circuit 92 is made up of: NPN transistors Q3 and Q4 which constitute a differential amplifier circuit; a second constant current source I2 connected between the common emitter node of the NPN transistors Q3 and Q4 and a ground potential node; and resistors R1 and R2 connected at one end to the collectors of the NPN transistors Q3 and Q4, respectively and at the other end to the predetermined single node.

The bases of NPN transistors Q3 and Q4 are connected to the bases of NPN transistors Q2 and Q1, respectively.

In FIG. 9, reference symbol Cs denotes a parasitic capacitance existing between the collector of the NPN transistor Q2 of the oscillator circuit 91 and a ground potential node. The parasitic capacitance is an equivalent representation of a synthetic capacitance, including mainly the collector-ground capacitance of NPN transistor Q2 and the base-collector capacitance Ccb4 (mirror capacitance) of NPN transistor Q4. The parasitic capacitance is AC-connected in parallel to the capacitive component C of the resonator circuit 90.

In the differential amplifier type oscillator circuit described above, the parasitic capacitance Cs is connected in parallel to the capacitance of the resonator circuit 90.

With this circuit configuration, if the collector potentials of the transistors Q2 and Q4 lower due to fluctuations in the power supply voltage, the parasitic resistance Cs increases, and the resonance characteristics of the resonator circuit 90 vary in such a manner that the resonance frequency f becomes lower. Conversely, if the collector potentials of the transistors in use rise, the parasitic resistance Cs decreases, and the resonance characteristics of the resonator circuit 90 vary in such a manner that the resonance frequency f becomes higher.

In summary, the exhaustion of a battery or the rotation of the motor of an oscillator circuit-incorporated device give rise to ripples superimposed on a power supply voltage, and the resultant fluctuations in the power supply voltage result in variations in the oscillation frequency.

As described above, the conventional oscillator circuit entails the problem that the level of the oscillation frequency varies, dependent on the fluctuations in the power supply voltage.

BRIEF SUMMARY OF THE INVENTION

The present invention has been developed in an effort to solve the above problem, and the object thereof is to provide a stabilized oscillator circuit capable of suppressing the variations in the level of the oscillation frequency in spite of fluctuations in the power supply voltage.

To attain this object, the present invention provides a stabilized oscillator circuit according to a first aspect of the present invention, comprising a differential amplifier type oscillator circuit; a differential buffer circuit for amplifying an oscillation signal of the differential amplifier type oscillator circuit and outputting the oscillation signal, the differential buffer circuit having a constant current source; and a frequency variation stabilizing circuit for controlling a current of the constant current source of the differential buffer circuit in accordance with a fluctuation of a power supply voltage applied to the differential amplifier type oscillator circuit to suppress a variation of a frequency of the oscillation signal.

In the stabilized oscillator circuit according to the first aspect of the present invention, the frequency variation stabilizing circuit may correct collector-base capacitance of differential amplifying transistors of the differential buffer circuit in accordance with the fluctuation of the power supply voltage.

In the stabilized oscillator circuit according to the first aspect of the present invention, the frequency variation stabilizing circuit may increase the current of the constant current source when the power supply voltage becomes higher and decrease the current of the constant current source when the power supply voltage becomes lower.

In the stabilized oscillator circuit according to the first aspect of the present invention, the frequency variation stabilizing circuit may include at least a resistor element which is connected between a power supply node of the differential amplifier type oscillator circuit and a portion of the constant current source of the differential buffer circuit.

In the stabilized oscillator circuit according to the first aspect of the present invention, the differential amplifier type oscillator circuit may include first and second NPN transistors constituting a differential amplifier circuit, the first and second NPN transistors having bases and collectors which are cross-connected and emitters which are connected to each other, the collector of the first NPN transistor being connected to a power supply node, the collector of the second NPN transistor being connected to the power supply node via a resonator circuit which is externally provided; and a constant current source connected between a common emitter node of the first and second NPN transistors and a ground potential node. In the stabilized oscillator circuit, the differential buffer circuit may include third and fourth NPN transistors constituting a differential amplifier circuit, the third and fourth NPN transistors having bases which are connected to the bases of the first and second NPN transistors respectively, and emitters which are mutually connected; the constant current source connected between a common emitter node of the third and fourth NPN transistors and the ground potential node; and first and second resistor elements connected between collectors of the third and fourth NPN transistors and the power supply node respectively. In the stabilized oscillator circuit, the constant current source of the differential buffer circuit may include a fifth NPN transistor and a third resistor element which are connected in series to each other and located between the common emitter node of the third and fourth NPN transistors and the ground potential node; a sixth NPN transistor having a base and a collector connected to a base of the fifth NPN transistor, the base and the collector of the sixth NPN transistor being connected also to a constant current source; and a fourth resistor element connected between an emitter of the sixth NPN transistor and the ground potential node. In the stabilized oscillator circuit, the frequency variation stabilizing circuit may include a fifth resistor element connected between the power supply node and one end of the fourth resistor element. In the stabilized oscillator circuit, the frequency variation stabilizing circuit may include fifth and sixth resistor elements which are inserted in series between the power supply node and one end of the fourth resistor element, and a diode-connected seventh NPN transistor and a seventh resistor element which are connected in series between a series connection node of the fifth and sixth resistor elements and the ground potential node.

In the stabilized oscillator circuit according to the first aspect of the present invention, the circuit may be used for a local oscillator of an FM radio receiver.

A receiver according to a second aspect of the present invention, comprising a radio frequency amplifier; a local oscillator; a mixer for mixing an output frequency signal of the radio frequency amplifier with an output frequency signal of the local oscillator for frequency conversion; an intermediate frequency amplifier for receiving and amplifying an output frequency signal of the mixer; and a detector for detecting an output frequency signal of the intermediate frequency amplifier; in which the local oscillator includes a differential amplifier type oscillator; a differential buffer for amplifying an oscillation signal of the differential amplifier type oscillator and outputting the oscillation signal, the differential buffer having a constant current source; and a frequency variation stabilizer for controlling a current of the constant current source of the differential buffer in accordance with a fluctuation of a power supply voltage applied to the differential amplifier type oscillator to suppress a variation of a frequency of the oscillation signal.

In the receiver according to the second aspect of the present invention, the frequency variation stabilizer may correct collector-base capacitance of differential amplifying transistors of the differential buffer in accordance with the fluctuation of the power supply voltage.

In the receiver according to the second aspect of the present invention, the frequency variation stabilizer may increase the current of the constant current source when the power supply voltage becomes higher and decrease the current of the constant current source when the power supply voltage becomes lower.

In the receiver according to the second aspect of the present invention, the frequency variation stabilizer may include at least a resistor element which is connected between a power supply node of the differential amplifier type oscillator and a portion of the constant current source of the differential buffer. In the receiver, the resistor element of the frequency variation stabilizer may be a DC-coupling resistor element for DC-connecting the power supply node of the differential amplifier type oscillator to the portion of the constant current source of the differential buffer.

In the receiver according to the second aspect of the present invention, the differential amplifier type oscillator may include first and second NPN transistors constituting a differential amplifier circuit, the first and second NPN transistors having bases and collectors which are cross-connected and emitters which are connected to each other, the collector of the first NPN transistor being connected to a power supply node; a constant current source connected between a common emitter node of the first and second NPN transistors and a ground potential node; and a resonator connected between the power supply node and the collector of the second NPN transistor. In the receiver, the differential buffer may include third and fourth NPN transistors constituting a differential amplifier, the third and fourth NPN transistors having bases which are connected to the bases of the first and second NPN transistors respectively, and emitters which are mutually connected; the constant current source connected between a common emitter node of the third and fourth NPN transistors and the ground potential node; and first and second resistor elements connected between collectors of the third and fourth NPN transistors and the power supply node respectively. In the receiver, the constant current source of the differential buffer may include a fifth NPN transistor and a third resistor element which are connected in series to each other and located between the common emitter node of the third and fourth NPN transistors and the ground potential node; a sixth NPN transistor having a base and a collector connected to a base of the fifth NPN transistor, the base and the collector of the sixth NPN transistor being connected also to a constant current source; and a fourth resistor element connected between an emitter of the sixth NPN transistor and the ground potential node. In the receiver, the frequency variation stabilizer may include a fifth resistor element connected between the power supply node and one end of the fourth resistor element. In the receiver, the frequency variation stabilizer may include fifth and sixth resistor elements which are inserted in series between the power supply node and one end of the fourth resistor element, and a diode-connected seventh NPN transistor and a seventh resistor element which are connected in series between a series connection node of the fifth and sixth resistor elements and the ground potential node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 1:
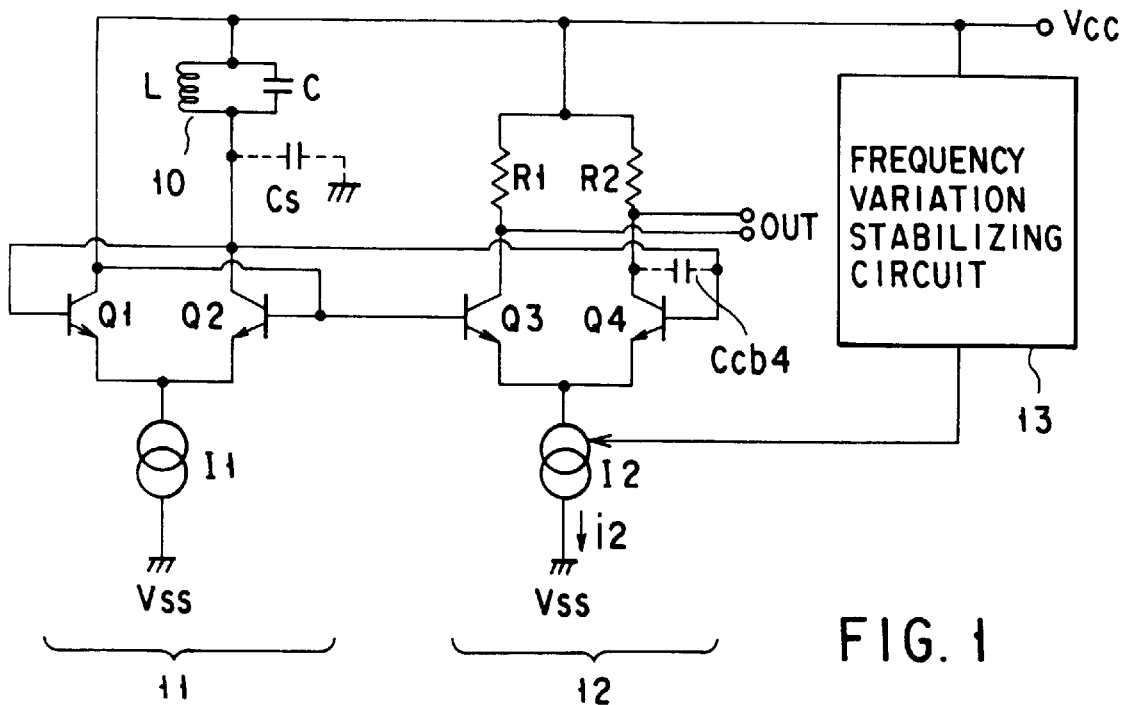
FIG. 1 is a circuit diagram showing the fundamental circuit configuration of a stabilized oscillator circuit embodying the present invention.

FIG. 1 is a circuit diagram showing the fundamental circuit configuration of a stabilized oscillator circuit embodying the present invention.

Figure 9:
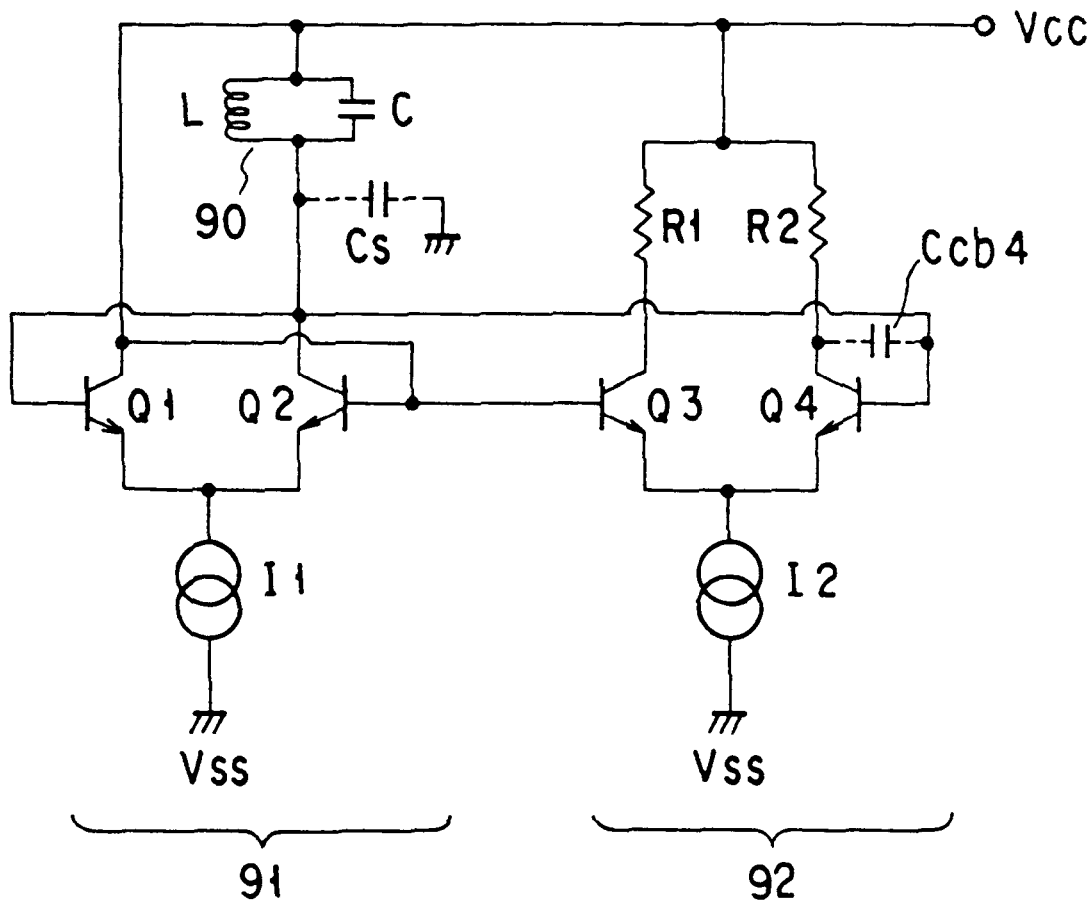
FIG. 9 is a circuit diagram showing an example of a conventional oscillator circuit.

Like the conventional circuit shown in FIG. 9, the circuit shown in FIG. 1 comprises a differential amplifier type oscillator circuit 11, and a differential amplifier type buffer output circuit 12 for amplifying an oscillation signal from the differential amplifier type oscillator circuit 11 and outputting the amplified oscillation signal. The circuit shown in FIG. 1 further includes a frequency variation stabilizing circuit 13. In other words, the circuit shown in FIG. 1 differs from that shown in FIG. 9 in that the frequency variation stabilizing circuit 13 is further provided.

The differential amplifier type oscillator circuit 11 includes NPN transistors Q1 and Q2, a first constant current source I1, and a resonator circuit 10 (the inductive component of the resonator circuit is denoted by L, and the capacitive component is denoted by C). The bases and collectors of the NPN transistors Q1 and Q2 are cross-connected. That is, the base and collector of NPN transistor Q1 are connected to the collector and base of NPN transistor Q2, respectively, thereby forming a differential amplifier. The emitters of NPN transistors Q1 and Q2 are connected to each other. The constant current source I1 is connected between the common emitter node of the transistors Q1 and Q2 and a ground potential node Vss. The resonator circuit 10 is connected between the power supply node Vcc and the collector of NPN transistor Q2, which is one of the two differential amplifier type transistors. The collector of the other transistor, namely, NPN transistor Q1, is connected to the power supply node Vcc.

The resonator circuit 10 is normally a resonator provided as an external component of an IC chip, and the circuits other than the resonator circuit 10 are incorporated inside the IC chip.

The buffer output circuit 12 is formed in the IC chip and comprises NPN transistors Q3 and Q4, a second constant current source I2, and resistors R1 and R2. The base of NPN transistor Q3 is connected to the base of NPN transistor Q2, and the base of NPN transistor Q4 is connected to the base of NPN transistor Q1. By this connection, NPN transistors Q3 and Q4 jointly constitute a differential amplifier. The emitters of NPN transistors Q3 and Q4 are connected to each other. The constant current source I2 is connected between the common emitter node of the transistors Q3 and Q4 and the ground potential node Vss. The base/collector of NPN transistor Q1 is connected to the collector/base of NPN transistor Q2, thereby forming a differential amplifier. The constant current source I2 has a dependency on the power supply voltage, and is connected between the common emitter node of transistors Q3 and Q4 and the ground potential node. The resistor elements R1 and R2 are connected at one end to the collectors of transistors Q3 and Q4, and at the other end to a predetermined single node.

The frequency variation stabilizing circuit 13 controls the current output i2 from the second constant current source I2, in accordance with the variations in the power supply voltage Vcc of the differential amplifier type oscillator circuit 11. By this control, at least the collector-base capacitance Ccb4 (mirror capacitance) of transistor Q4, the base of which is connected to the resonator circuit 10, is corrected.

Figure 2:
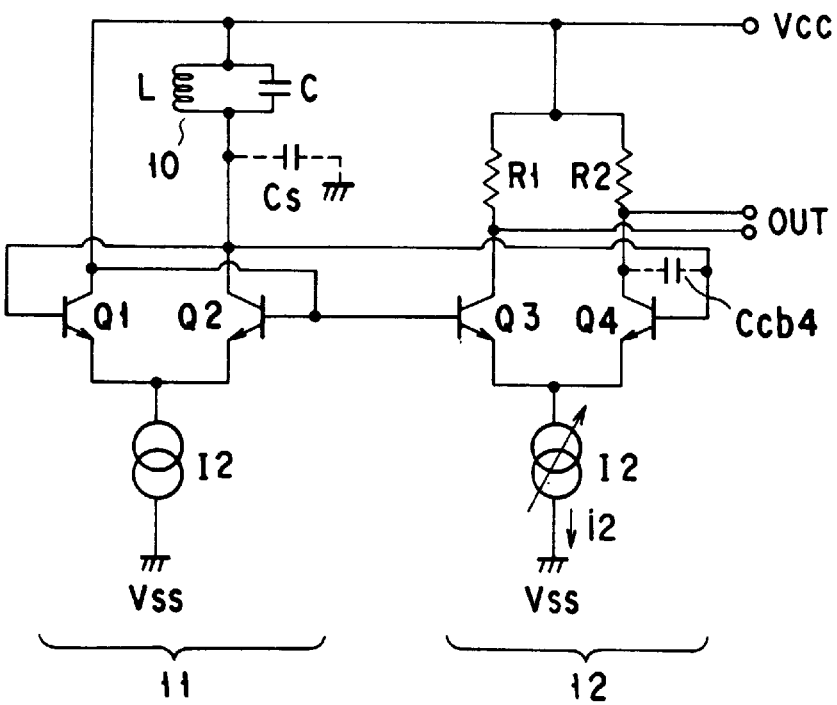
FIG. 2 is an equivalent circuit diagram of the stabilized oscillator circuit shown in FIG. 1.

FIG. 2 shows an equivalent circuit of the stabilized oscillator circuit of FIG. 1. The second constant current source I2 of the stabilized oscillator circuit can be equivalently represented by a variable constant current source, as shown in FIG. 2.

Reference symbol Cs denotes a parasitic capacitance existing between the collector of NPN transistor Q2 of the oscillator circuit 11 and a ground potential node. The parasitic capacitance is equivalent to the sum of capacitances, mainly including the collector-ground capacitance of NPN transistor Q2 and the base-collector capacitance Ccb4 (mirror capacitance) of NPN transistor Q4. The parasitic capacitance is AC-connected in parallel to the capacitive component C of the resonator circuit 10.

Figure 4A:
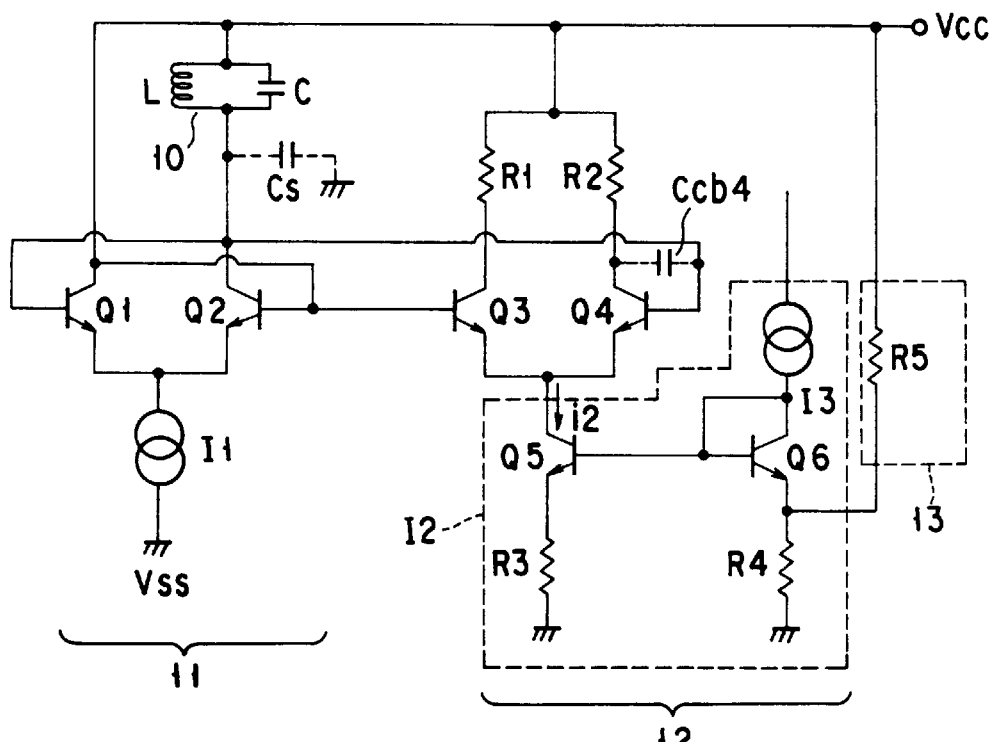
FIG. 4A is a circuit diagram showing a stabilized oscillator circuit according to the first embodiment of the present invention.
Figure 5A:
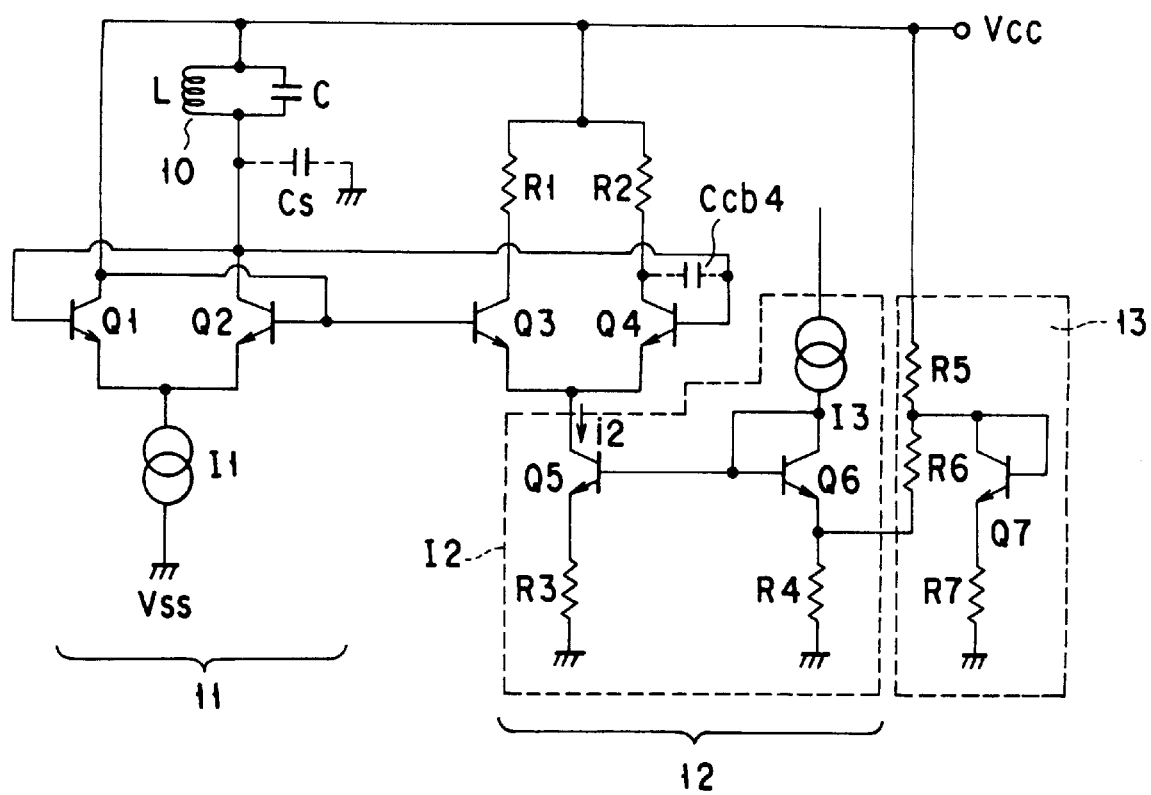
FIG. 5A is a circuit diagram showing a stabilized oscillator circuit according to the second embodiment of the present invention.

A specific example of the second constant current source I2 is illustrated in FIGS. 4A and 5A, which show the stabilized oscillator circuits according to the first and second embodiments, respectively. As illustrated in those Figures, the second constant current source I2 comprises NPN transistors Q5 and Q6, resistor elements R3 and R4 and third constant current source I3. NPN transistor Q5 and resistor element R3 are connected in series between the common emitter node of transistors Q3 and Q4 and a ground potential node. The base and collector of NPN transistor Q6 are connected to NPN transistor Q5, and the collector of NPN transistor Q6 is also connected to the third constant current source I3. Resistor element R4 is connected between the emitter of NPN transistor Q6 and a ground potential node.

The frequency variation stabilizing circuit 13 comprises, at least, a DC coupling resistor element R5. This resistor element R5 is connected between the power supply node of the differential amplifier type oscillator circuit 11 and part of the second constant current source I2. In other words, the power supply node Vcc of the differential amplifier type oscillator circuit 11 is DC-coupled to part of the second constant current I2 by way of the resistor element R5 of the frequency variation stabilizing circuit 13.

A specific example of the frequency variation stabilizing circuit 13 is illustrated in FIG. 4A, which shows the stabilized oscillator circuits according to the first embodiment. As illustrated in the Figure, the frequency variation stabilizing circuit 13 comprises a DC coupling resistor element R5 inserted in series between the power supply node of the differential amplifier type oscillator circuit and one end of resistor element R4 of the second constant current source I2.

Figure 3:
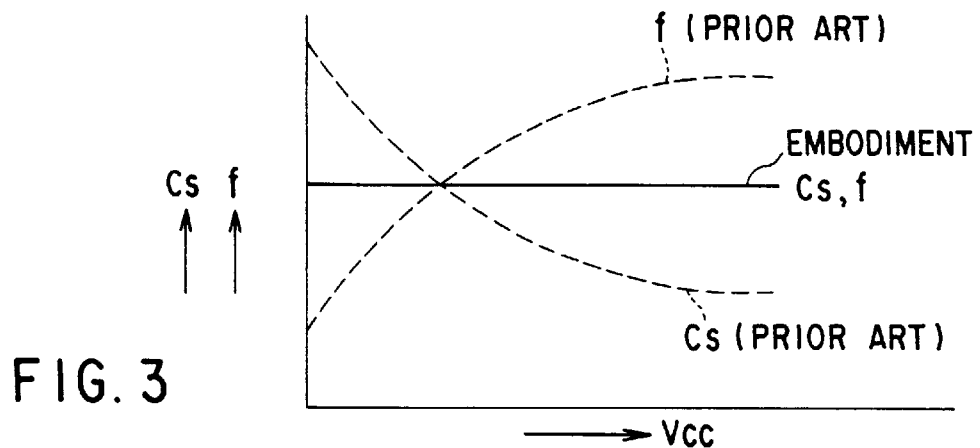
FIG. 3 is a graph showing how an oscillation frequency is dependent on a power supply voltage in the fundamental configuration circuit depicted in FIG. 1.

FIG. 3 shows how the parasitic capacitance Cs and oscillation frequency f are dependent on the power supply voltage (Vcc) in the conventional circuit depicted in FIG. 9 and the fundamental configuration circuit shown in FIG. 1.

A description will now be given, with reference to FIG. 3, of as to how the dependency of both parasitic capacitance Cs and oscillation frequency f on the power supply voltage (Vcc) is corrected in the fundamental configuration circuit shown in FIG. 1. In FIG. 2, the broken lines show how the parasitic capacitance Cs and oscillation frequency f are dependent on the power supply voltage in the circuit depicted in FIG. 5 (the prior art), while the solid line show how they are independent of the power supply voltage in the fundamental configuration circuit depicted in FIG. 5 (the present invention).

In the fundamental configuration circuit shown in FIG. 1, the parasitic capacitance Cs is equivalent to a capacitance connected in parallel to the resonance circuit 10. When the power supply voltage Vcc fluctuates, the potentials at the collectors of the NPN transistors Q2 and Q4 vary. In this situation, the parasitic capacitance Cs varies, and the resonance characteristics of the resonance circuit 10 is about to vary in such a manner as is indicated with the broken lines in FIG. 2.

However, the frequency variation stabilizing circuit 13 controls the amount of current produced from the second constant current source I2, in accordance with variations in the level of the power supply voltage Vcc. To be more specific, the frequency variation stabilizing circuit 13 increases the current from the second constant current source I2 when the power supply voltage Vcc is high, and decreases that current when the power source voltage Vcc is low. By this control, the collector-base capacitance Ccb4 (mirror capacitance) of transistor Q4, which is one of the two transistors of the differential amplifier type buffer output circuit and which is the one whose base is connected to the resonance circuit 10.

A more detailed description will be given of the correction of capacitance Ccb4 (mirror capacitance). If the collector potentials of the transistors Q2 and Q4 in use lower due to fluctuations in the power supply voltage, the parasitic resistance Cs increases, as indicated by one of the broken lines in FIG. 3. Although, in the case of the prior art, the resonance characteristics of the resonator circuit 10 vary in such a manner that the resonance frequency f becomes lower, this does not occur in the case of the present invention. According to the present invention, the frequency variation stabilizing circuit 13 reduces the amount of current provided by the second constant current source I2. Owing to this, the gain of the differential amplifier type circuit transistors (Q3, Q4) becomes low, and the collector-base capacitance Ccb4 (mirror capacitance) of the transistor Q4 decreases. Hence, the parasitic resistance Cs does not significantly increase, as indicated by the solid line in FIG. 3, and the oscillation frequency f is prevented from becoming low.

Conversely, if the collector potentials of the transistors Q2 and Q4 rise in accordance with an increase in the level of the power supply voltage, the parasitic resistance Cs decreases, as indicated by one of the broken lines in FIG. 3. Although, in the case of the prior art, the resonance characteristics of the resonator circuit 10 vary in such a manner that the resonance frequency f becomes higher, this does not occur in the case of the present invention. According to the present invention, the frequency variation stabilizing circuit 13 increases the amount of current provided by the second constant current source I2. Owing to this, the gain of the differential amplifier type circuit transistors (Q3, Q4) becomes high, and the collector-base capacitance Ccb4 (mirror capacitance) of the transistor Q4 increases. Hence, the parasitic resistance Cs does not significantly decrease, as indicated by the solid line in FIG. 1, and the oscillation frequency f is prevented from becoming high.

Therefore, the circuit shown in FIG. 1 operates reliably even when it is incorporated in a system whose power supply voltage varies greatly (for example, in the range of 3V to 1.8V or so) for a number of reasons, such as an unstable power supply level, the exhaustion of a battery, or ripple variations (e.g., 50 to 100 Hz) that are superimposed on the power supply voltage as a result of the rotation of the motor of an oscillator circuit-incorporated device. That is, the oscillation frequency variations are suppressed in spite of fluctuations in the power supply voltage, and the oscillation frequency (e.g., a frequency of an FM wave reception band).

FIG. 4A shows a stabilized oscillator circuit according to the first embodiment of the present invention. The stabilized oscillator circuit shown in FIG. 4A is similar to the fundamental configuration circuit shown in FIG. 1, except that it incorporates specific examples of the buffer output circuit 12 and the frequency variation stabilizing circuit 13. In FIG. 4A, therefore, the same reference numerals as in FIG. 1 will be used to denote the corresponding or similar structural components, and a repetitive explanation will be omitted.

As can be seen from the stabilized oscillator circuit shown in FIG. 4A, the specific example of the second constant current source I2 comprises NPN transistors Q5 and Q6, resistor elements R3 and R4, and third constant current source I3. NPN transistor Q5 and resistor element R3 are connected in series between the common emitter node of transistors Q3 and Q4 and a ground potential node. The base and collector of NPN transistor Q6 are connected to the base of NPN transistor Q5, and the collector of that NPN transistor Q6 is also connected to the third constant current source I3. Resistor element R4 is connected between the emitter of NPN transistor Q6 and the ground potential node.

As can be seen from the stabilized oscillator circuit shown in FIG. 4A, the specific example of the frequency variation stabilizing circuit 13 comprises a DC coupling resistor element R5. One end of the resistor element R5 is connected to the power supply node Vcc of the differential amplifier type oscillator circuit 11, while the other end thereof is connected to the predetermined point of the second constant current source I2 of the differential amplifier type oscillator circuit 12. In the present embodiment, the predetermined point is that end of the resistor element R4 of the second constant current source I2 which is connected to the emitter of NPN transistor Q6. In other words, the power supply node Vcc of the differential amplifier type oscillator circuit 11 is DC-coupled to that end of the resistor element R4 of the second constant current source I2 which is connected to the emitter of the NPN transistor Q6, in such a manner that resistor R5 is interposed between the power supply node Vcc and the resistor element R4. The frequency variation stabilizing circuit 13 of the stabilized oscillator circuit shown in FIG. 4A corrects the mirror capacitance Ccb4 in such a manner that the dependency of the mirror capacitance Ccb4 on the power supply source is linear in the graph shown in FIG. 4B. Since the dependence of the mirror capacitance Ccb4 on the power supply voltage corresponds substantially to the dependence of the oscillation frequency on the power supply voltage, it follows that the frequency variation stabilizing circuit 13 corrects the dependence of the oscillation frequency f of the stabilized oscillator circuit shown in FIG. 4A on the power supply voltage in such a manner that the corrected dependence describes linear data.

Figure 4B:
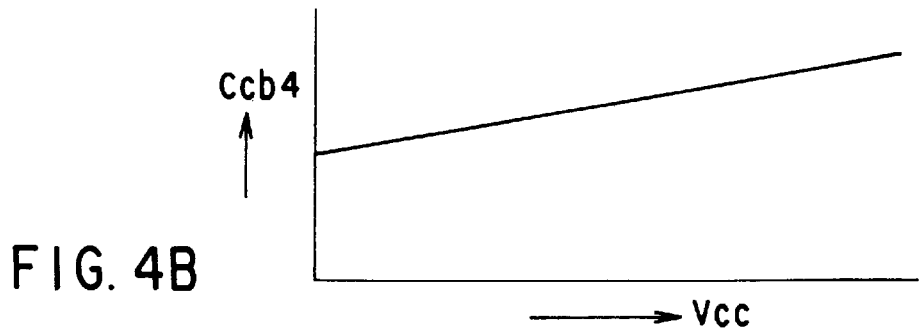
FIG. 4B is a graph showing a correction characteristic according to which the dependency of the oscillation frequency on the power supply voltage is corrected in the stabilized oscillator circuit shown in FIG. 4A.

Due to the use of the frequency variation stabilizing circuit 13 of this circuit configuration, the relationships between the power supply voltage Vcc and the mirror capacitance Ccb4 of the transistor Q4 of the second constant current source I2 are depicted as substantially linear, as shown in FIG. 4B. The inclination of the linear characteristic shown in FIG. 4B can be controlled in accordance with the inclination of the linear portion of the CS characteristics indicated by the broken line in FIG. 3 and corresponding to the prior art shown in FIG. 9, by properly determining the ratio of the resistance values of R4 and R5. As a result, the dependence of the parasitic capacitance Cs of the prior art (FIG. 9) on the power supply voltage and the dependence of the oscillation frequency f on the power supply voltage Vcc reduce. Accordingly, the stabilized oscillator circuit shown in FIG. 4A suppresses the oscillation frequency variations in spite of fluctuations in the power supply voltage and produces a stable oscillation frequency (e.g., a frequency within an FM wave reception band), even when it is incorporated in a system wherein the power supply voltage fluctuates greatly (for example, in the range of 3V to 1.8V or so).

FIG. 5A shows a specific example of a stabilized oscillator circuit according to the second embodiment of the present invention. The stabilized oscillator circuit shown in FIG. 5A is similar to the fundamental configuration circuit shown in FIG. 1, except that it incorporates specific examples of the buffer output circuit 12 and the frequency variation stabilizing circuit 13. In FIG. 5A, therefore, the same reference numerals as in FIG. 1 will be used to denote the corresponding or similar structural components, and a repetitive explanation will be omitted.

As can be seen from the stabilized oscillator circuit shown in FIG. 5A, the specific example of the second constant current source I2 comprises NPN transistors Q5 and Q6, resistor elements R3 and R4, and third constant current source I3. NPN transistor Q5 and resistor element R3 are connected in series between the common emitter node of transistors Q3 and Q4 and a ground potential node. The base and collector of NPN transistor Q6 are connected to the base of NPN transistor Q5, and the collector of that NPN transistor Q6 is also connected to the third constant current source I3. Resistor element R4 is connected between the emitter of NPN transistor Q6 and the ground potential node.

As can be seen from the stabilized oscillator circuit shown in FIG. 5A, the specific example of the frequency variation stabilizing circuit 13 comprises resistor elements R5 and R6 which are connected in series for DC coupling. One end of resistor element R5 is connected to the power supply node Vcc of the differential amplifier type oscillator circuit 11, and one end of resistor element R6 is connected to the predetermined point of the second constant current source I2 of the differential amplifier type oscillator circuit 12. In the present embodiment, the predetermined point is that end of the resistor element R4 of the second constant current source I2 which is connected to the emitter of NPN transistor Q6. The other ends of resistor element R5 is connected to the other end of resistor element R6. In other words, in the present embodiment, the power supply node Vcc of the differential amplifier type oscillator circuit 11 is DC-coupled to that end of the resistor element R4 of the second constant current source I2 which is connected to the emitter of the NPN transistor Q6, in such a manner that resistors R5 and R6 are interposed between the power supply node Vcc and the resistor element R4. The frequency variation stabilizing circuit 13 of the stabilized oscillator circuit shown in FIG. 5A further comprises diode-connected NPN transistor Q7 and resistor element R7 which are connected in series between the connection node of resistor elements R5 and R6 and a potential ground node.

In the frequency variation stabilizing circuit 13 of this configuration, diode-connected NPN transistor Q7 is in the OFF state when the power supply voltage Vcc is lower than a predetermined value, and is turned on when the power supply voltage exceeds that value.

Figure 5B:
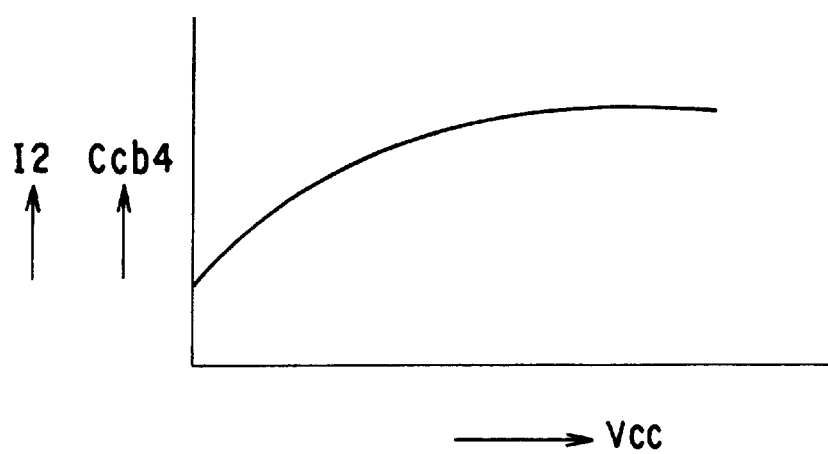
FIG. 5B is a graph showing a correction characteristic according to which the dependency of the oscillation frequency on the power supply voltage is corrected in the stabilized oscillator circuit shown in FIG. 5A.

Owing to the voltage-current characteristics of the diode-connected NPN transistor Q7, the relationships between the power supply voltage Vcc and the current from the second constant current source I2 and the relationships between the power supply voltage Vcc and the mirror capacitance Ccb4 of transistor Q4 are restricted. As shown in FIG. 5B, the relationships between the power supply voltage Vcc and the mirror capacitance Ccb4 of transistor Q4 are not linear. The inclination of the nonlinear characteristic shown in FIG. 5B can be controlled in accordance with the inclination of the nonlinear portion of the CS characteristics indicated by the broken line in FIG. 3 and corresponding to the prior art shown in FIG. 9, by properly determining the ratio of the resistance values of R5 and R6. As a result, the dependence of the parasitic capacitance Cs of the prior art (FIG. 9) on the power supply voltage and the dependence of the oscillation frequency f on the power supply voltage Vcc reduce. Accordingly, the stabilized oscillator circuit shown in FIG. 5A suppresses the oscillation frequency variations in spite of fluctuations in the power supply voltage and produces a stable oscillation frequency (e.g., a frequency within an FM wave reception band), even when it is incorporated in a system wherein the power supply voltage fluctuates greatly (for example, in the range of 3V to 1.8V or so).

Figure 6:
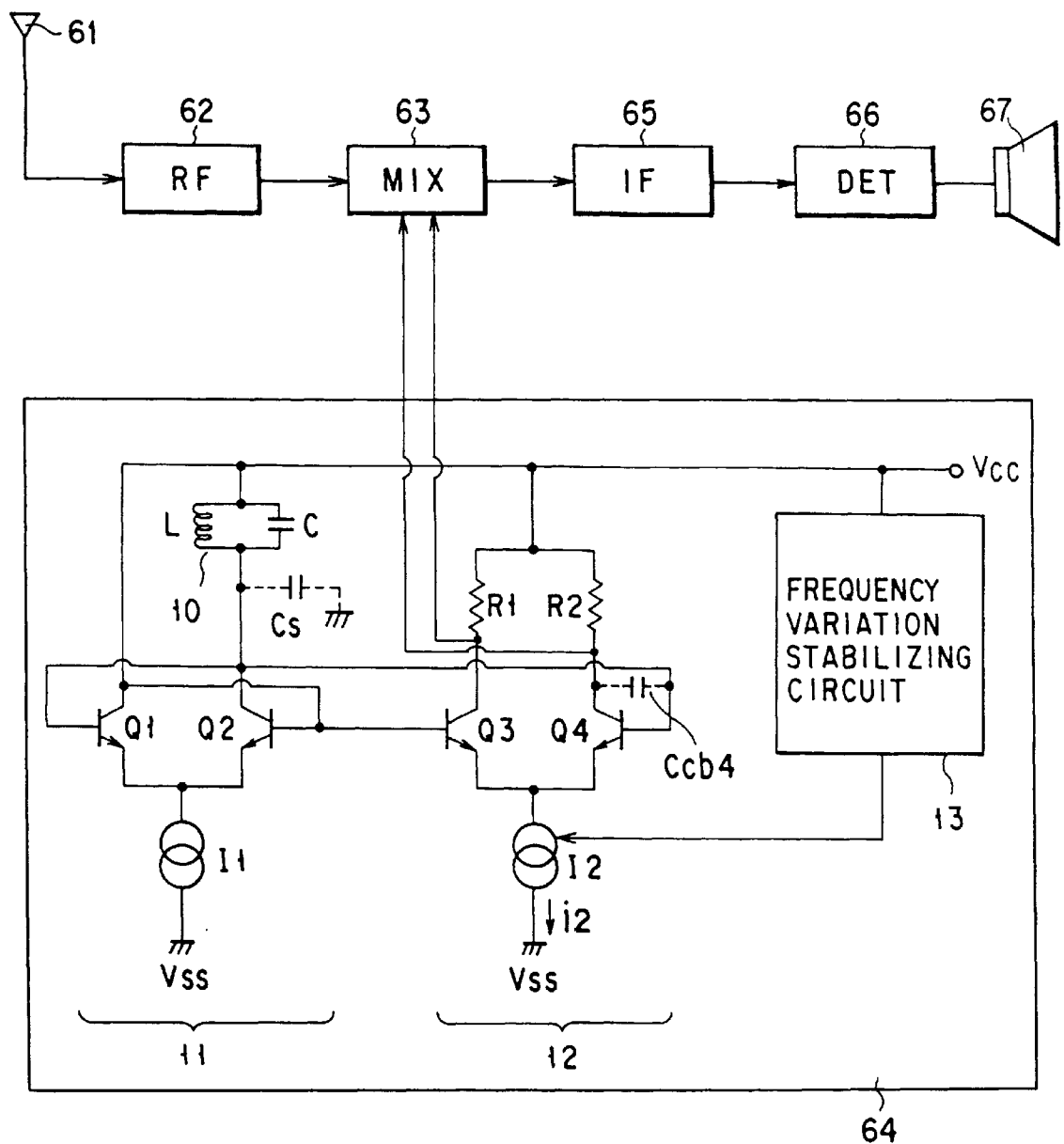
FIG. 6 shows a block diagram of a radio frequency receiver circuit using the stabilized oscillator circuit as shown in FIG. 1.
Figure 7:
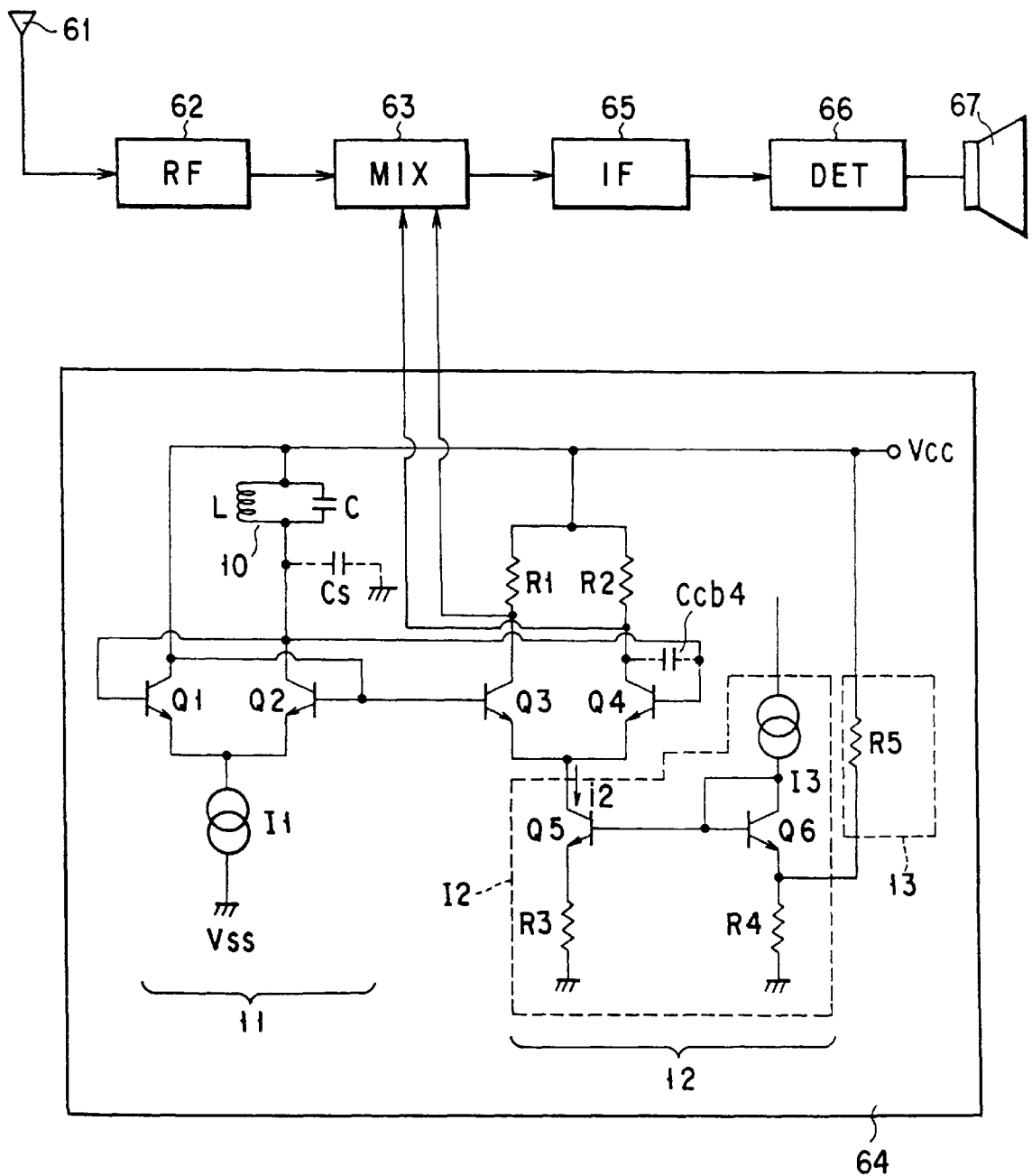
FIG. 7 shows a block diagram of a radio frequency receiver circuit using the stabilized oscillator circuit as shown in FIG. 4A.
Figure 8:
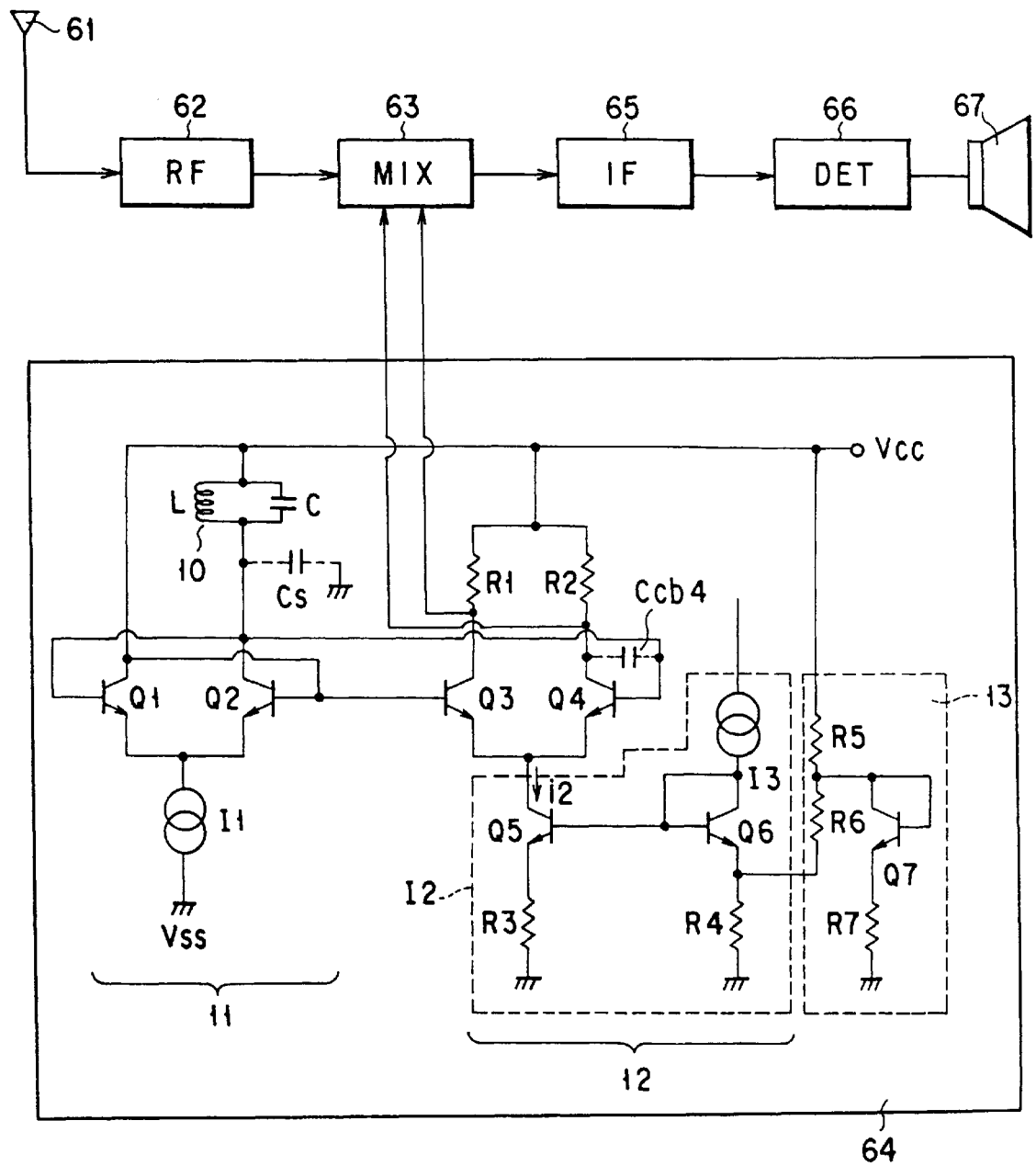
FIG. 8 shows a block diagram of a radio frequency receiver circuit using the stabilized oscillator circuit as shown in FIG. 5A.

FIGS. 6, 7 and 8 respectively show block diagrams of radio frequency receivers using the stabilized oscillator circuits as shown in FIGS. 1, 4A and 5A described in the above embodiments.

As shown in FIG. 6, the receiver comprises an antenna 61, a radio frequency amplifier 62, a mixer 63, an local oscillator 64, an intermediate-frequency amplifier 65, a detector 66, and a speaker 67. Specifically, in the receiver shown in FIG. 6, a radio frequency signal is received by the antenna 61, and then inputted to the radio frequency amplifier 62 to be amplified. The high-frequency amplified signal is inputted to the mixer 63 to be mixed with an oscillation signal of the local oscillator 64 for frequency conversion. The mixed signal is inputted to the intermediate-frequency amplifier 65, and the amplified signal is further input to the detector 66. A detected signal by the detector 66 is outputted through the speaker 67. In the receiver shown in FIG. 6, the stabilized oscillator circuit of FIG. 1 is employed in the local oscillator 64. Since the stabilized oscillator circuit of FIG. 1 can suppress the oscillation frequency variations in spite of fluctuations of the power supply voltage as will be obvious from the description with reference to FIG. 1, then the accuracy of the frequency conversion by the mixer 63 can be improved. Also in the receivers shown in FIGS. 7 and 8, the frequency conversion by the mixer 63 can be highly improved. The block diagrams of the receivers shown in FIGS. 7 and 8 are similar to the fundamental configuration circuit diagram shown in FIG. 6, except that the structures of the local oscillators 64 are respectively formed of the stabilized oscillator circuits shown in FIGS. 4A and 5A. In FIGS. 7 and 8, therefore, the same reference numerals as in FIG. 6 are used to denote the corresponding or similar structural components, and the explanation is omitted.

As described above, the stabilized oscillator circuit of the present invention suppresses the oscillation frequency variations in spite of fluctuations in the power supply voltage and produces a stable oscillation frequency, even when it is employed in a system whose power supply voltage fluctuates greatly for a number of reasons, including the reason that the power supply voltage itself is not stable, the reason that a power supply battery is exhausted, and the reason that the rotation of the motor of an oscillator circuit-incorporated device gives rise to ripples superimposed on a power supply voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stabilized oscillator circuit comprising:

a differential amplifier type oscillator circuit;

a differential buffer circuit for amplifying an oscillation signal of the differential amplifier type oscillator circuit and outputting the oscillation signal, the differential buffer circuit having a constant current source; and a frequency variation stabilizing circuit for controlling a current of the constant current source of the differential buffer circuit in accordance with a fluctuation of a power supply voltage applied to the differential amplifier type oscillator circuit to suppress a variation of a frequency of the oscillation signal.

2. A stabilized oscillator circuit according to claim 1, wherein said frequency variation stabilizing circuit corrects collector-base capacitance of differential amplifying transistors of the differential buffer circuit in accordance with the fluctuation of the power supply voltage.

3. A stabilized oscillator circuit according to claim 1, wherein said frequency variation stabilizing circuit increases the current of the constant current source when the power supply voltage becomes higher and decreases the current of the constant current source when the power supply voltage becomes lower.

4. A stabilized oscillator circuit according to claim 1, wherein said frequency variation stabilizing circuit includes at least a resistor element which is connected between a power supply node of the differential amplifier type oscillator circuit and a portion of the constant current source of the differential buffer circuit.

5. A stabilized oscillator circuit according to claim 1, wherein said differential amplifier type oscillator circuit includes first and second NPN transistors constituting a differential amplifier circuit, said first and second NPN transistors having bases and collectors which are cross-connected and emitters which are connected to each other, the collector of the first NPN transistor being connected to a power supply node, the collector of the second NPN transistor being connected to the power supply node via a resonator circuit which is externally provided; and a constant current source connected between a common emitter node of the first and second NPN transistors and a ground potential node.

6. A stabilized oscillator circuit according to claim 5, wherein said differential buffer circuit includes third and fourth NPN transistors constituting a differential amplifier circuit, said third and fourth NPN transistors having bases which are connected to the bases of the first and second NPN transistors respectively, and emitters which are mutually connected; the constant current source connected between a common emitter node of the third and fourth NPN transistors and the ground potential node; and first and second resistor elements connected between collectors of the third and fourth NPN transistors and the power supply node respectively.

7. A stabilized oscillator circuit according to claim 6, wherein said constant current source of the differential buffer circuit includes a fifth NPN transistor and a third resistor element which are connected in series to each other and located between the common emitter node of the third and fourth NPN transistors and the ground potential node; a sixth NPN transistor having a base and a collector connected to a base of the fifth NPN transistor, the base and the collector of the sixth NPN transistor being connected also to a constant current source; and a fourth resistor element connected between an emitter of the sixth NPN transistor and the ground potential node.

8. A stabilized oscillator circuit according to claim 7, wherein said frequency variation stabilizing circuit includes a fifth resistor element connected between the power supply node and one end of the fourth resistor element.

9. A stabilized oscillator circuit according to claim 7, wherein said frequency variation stabilizing circuit includes fifth and sixth resistor elements which are inserted in series between the power supply node and one end of the fourth resistor element, and a diode-connected seventh NPN transistor and a seventh resistor element which are connected in series between a series connection node of the fifth and sixth resistor elements and the ground potential node.

10. A stabilized oscillator circuit according to claim 1, wherein said circuit is used for a local oscillator of an FM radio receiver.

11. A receiver comprising:

a radio frequency amplifier;

a local oscillator;

a mixer for mixing an output frequency signal of the radio frequency amplifier with an output frequency signal of the local oscillator for frequency conversion;

an intermediate frequency amplifier for receiving and amplifying an output frequency signal of the mixer; and a detector for detecting an output frequency signal of the intermediate frequency amplifier; in which said local oscillator includes:

a differential amplifier type oscillator;

a differential buffer for amplifying an oscillation signal of the differential amplifier type oscillator and outputting the oscillation signal, the differential buffer having a constant current source; and a frequency variation stabilizer for controlling a current of the constant current source of the differential buffer in accordance with a fluctuation of a power supply voltage applied to the differential amplifier type oscillator to suppress a variation of a frequency of the oscillation signal.

12. A receiver according to claim 11, wherein said frequency variation stabilizer corrects collector-base capacitance of differential amplifying transistors of the differential buffer in accordance with the fluctuation of the power supply voltage.

13. A receiver according to claim 11, wherein said frequency variation stabilizer increases the current of the constant current source when the power supply voltage becomes higher and decreases the current of the constant current source when the power supply voltage becomes lower.

14. A receiver according to claim 11, wherein said frequency variation stabilizer includes at least a resistor element which is connected between a power supply node of the differential amplifier type oscillator and a portion of the constant current source of the differential buffer.

15. A receiver according to claim 14, wherein said resistor element of said frequency variation stabilizer is a DC-coupling resistor element for DC-connecting the power supply node of the differential amplifier type oscillator to the portion of the constant current source of the differential buffer.

16. A receiver according to claim 11, wherein said differential amplifier type oscillator includes first and second NPN transistors constituting a differential amplifier circuit, said first and second NPN transistors having bases and collectors which are cross-connected and emitters which are connected to each other, the collector of the first NPN transistor being connected to a power supply node; a constant current source connected between a common emitter node of the first and second NPN transistors and a ground potential node; and a resonator connected between the power supply node and the collector of the second NPN transistor.

17. A receiver according to claim 16, wherein said differential buffer includes third and fourth NPN transistors constituting a differential amplifier, said third and fourth NPN transistors having bases which are connected to the bases of the first and second NPN transistors respectively, and emitters which are mutually connected; the constant current source connected between a common emitter node of the third and fourth NPN transistors and the ground potential node; and first and second resistor elements connected between collectors of the third and fourth NPN transistors and the power supply node respectively.

18. A receiver according to claim 17, wherein said constant current source of the differential buffer includes a fifth NPN transistor and a third resistor element which are connected in series to each other and located between the common emitter node of the third and fourth NPN transistors and the ground potential node; a sixth NPN transistor having a base and a collector connected to a base of the fifth NPN transistor, the base and the collector of the sixth NPN transistor being connected also to a constant current source; and a fourth resistor element connected between an emitter of the sixth NPN transistor and the ground potential node.

19. A receiver according to claim 18, wherein said frequency variation stabilizer includes a fifth resistor element connected between the power supply node and one end of the fourth resistor element.

20. A receiver according to claim 18, wherein said frequency variation stabilizer includes fifth and sixth resistor elements which are inserted in series between the power supply node and one end of the fourth resistor element, and a diode-connected seventh NPN transistor and a seventh resistor element which are connected in series between a series connection node of the fifth and sixth resistor elements and the ground potential node.

* * * * *